(12) United States Patent
Huang et al.

(10) Patent No.: US 7,888,767 B2
(45) Date of Patent: Feb. 15, 2011

(54) STRUCTURES OF HIGH-VOLTAGE MOS DEVICES WITH IMPROVED ELECTRICAL PERFORMANCE

(75) Inventors: Kun-Ming Huang, Taipei (TW); Hsueh-Liang Chou, Jhubei (TW); Weng-Chu Chu, Qionglin Shiang (TW); Chen-Bau Wu, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 169 days.

(21) Appl. No.: 11/588,902

(22) Filed: Oct. 26, 2006

(65) Prior Publication Data
US 2008/0017948 A1 Jan. 24, 2008

Related U.S. Application Data

(60) Provisional application No. 60/832,477, filed on Jul. 21, 2006.

(51) Int. Cl.
*H01L 29/02* (2006.01)
(52) U.S. Cl. ............. 257/487; 257/409; 257/E29.023
(58) Field of Classification Search ......... 257/371, 257/409, 487, 500, 501, E29.023
See application file for complete search history.

(56) References Cited

U.S. PATENT DOCUMENTS

| | | | | |
|---|---|---|---|---|
| 4,803,533 A | * | 2/1989 | Chang et al. | 257/345 |
| 6,242,787 B1 | * | 6/2001 | Nakayama et al. | 257/493 |
| 6,265,752 B1 | | 7/2001 | Liu et al. | |
| 6,376,891 B1 | * | 4/2002 | Nagatani et al. | 257/492 |
| 7,375,398 B2 | * | 5/2008 | Wang et al. | 257/355 |
| 2002/0050619 A1 | * | 5/2002 | Kawaguchi et al. | 257/368 |
| 2003/0057459 A1 | * | 3/2003 | Rumennik | 257/288 |
| 2004/0150041 A1 | * | 8/2004 | Watanabe et al. | 257/343 |

* cited by examiner

*Primary Examiner*—Thao X Le
*Assistant Examiner*—Robert Huber
(74) *Attorney, Agent, or Firm*—Slater & Matsil, L.L.P.

(57) ABSTRACT

A semiconductor structure includes a first high-voltage well (HVW) region of a first conductivity type overlying a substrate, a second HVW region of a second conductivity type opposite the first conductivity type overlying the substrate and laterally adjoining the first HVW region, and a third HVW region of the second conductivity type underlying the second HVW region. A region underlying the first HVW region is substantially free from the third HVW region, wherein the third HVW region has a bottom lower than a bottom of the first HVW region. The semiconductor structure further includes an insulation region in a portion and extending from a top surface of the first HVW region into the first HVW region, a gate dielectric extending from over the first HVW region to over the second HVW region wherein the gate dielectric has a portion over the insulation region, and a gate electrode on the gate dielectric.

18 Claims, 7 Drawing Sheets

STRUCTURES OF HIGH-VOLTAGE MOS DEVICES WITH IMPROVED ELECTRICAL PERFORMANCE

This application claims priority to the following U.S. provisional patents: Patent Application Ser. No. 60/832,477, filed Jul. 21, 2006, entitled "Structures of High-Voltage MOS Devices with Improved Electrical Performance," which patent application is incorporated herein by reference.

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, AC/DC converters, etc.

There are a variety of forms of HVMOS devices. A symmetric HVMOS device may have a symmetric structure on the source side and drain side. High voltage can be applied on both drain and source sides. An asymmetric HVMOS device may have asymmetric structures on the source side and drain side. For example, only one of the source side and drain side, typically the drain side, is designed for sustaining high voltages.

FIG. 1 illustrates a conventional asymmetric HVNMOS device 2, which includes gate oxide 10, gate electrode 12 on gate oxide 10, drain region 4 in a high-voltage n-well region 1 (HVNW1), and a source region 6 in a high-voltage p-well region 1 (HVPW1). A shallow trench isolation (STI) region 8 spaces drain region 4 and gate electrode 12 apart so that a high drain-to-gate voltage can be applied.

HVNMOS device 2 is formed on a high-voltage anti-punch-through (APT) region 14, which is of p-type, and is referred to as an HVNAPT region 14, wherein the letter "N" indicates an n-type inversion region formed in HVNAPT region 14 during the operation of HNVMOS device 2. When a high voltage is applied to drain region 4, wherein the voltage can be as high as 20 volts, a high voltage is also applied to HVNW1 region. Assuming HVNAPT region 14 is not formed, and HVPW1 region and HVNW1 region are formed directly on p-substrate 16, the high voltage applied on drain region 4 will cause inversion regions (not shown) to be generated at the interface of HVNW1 region and p-substrate 16. On the HVNW1 region side, the inversion region is of p-type, and on the p-substrate 16 side, the inversion region is of n-type. Since p-substrate 16 is typically lightly doped, the inversion region in p-substrate 16 extends for a relatively great distance. The inversion region may be connected to another inversion region of HVNW2 region, which belongs to a neighboring HVNMOS device 18. A punch-through thus occurs. To solve this problem, a HVNAPT region 14 is formed underlying HVNMOS devices. Since HVNAPT regions are doped with a p-type impurity with a significantly greater concentration than in p-substrate 16, the thicknesses of the respective inversion regions are significantly less, and thus punch-through is prevented.

The conventional HVNMOS devices illustrated in FIG. 1 have drawbacks, however. FIG. 2 illustrates an I-V curve obtained from an HVNMOS device shown in FIG. 1, wherein the X-axis represents voltages applied on drain region 4, and the Y-axis represents drive currents. It is noted that if a high voltage Vg, for example, 20V, is applied, the drive currents do not saturate, or in other words, do not pinch, with the increase in drain voltages. This indicates an output resistance problem, which will cause device reliability problems. Therefore, a solution for the above-discussed problem is needed.

SUMMARY OF THE INVENTION

In accordance with one aspect of the present invention, a semiconductor structure includes a first high-voltage well (HVW) region of a first conductivity type overlying a substrate, a second HVW region of a second conductivity type opposite the first conductivity type overlying the substrate and laterally adjoining the first HVW region, and a third HVW region of the second conductivity type underlying the second HVW region. A region underlying the first HVW region is substantially free from the third HVW region, wherein the third HVW region has a bottom lower than a bottom of the first HVW region. The semiconductor structure further includes an insulation region and extending from a top surface of the first HVW region into the first HVW region, a gate dielectric extending from over the first HVW region to over the second HVW region wherein the gate dielectric has a portion over the insulation region, and a gate electrode on the gate dielectric.

In accordance with another aspect of the present invention, a semiconductor structure includes a semiconductor substrate, a first HVW region of a first conductivity type directly on the substrate, a second HVW region of a second conductivity type opposite the first conductivity directly on the substrate and laterally adjoining the first HVW region, wherein the first HVW region has a first thickness substantially less than a second thickness of the second HVW region, an insulation region in the first HVW region and spaced apart from an interface between the first and the second HVW regions, a gate dielectric extending from over the insulation region to over the second HVW region, and a gate electrode on the gate dielectric.

In accordance with yet another aspect of the present invention, a semiconductor structure includes a semiconductor substrate, a high-voltage n-well (HVNW) region overlying the substrate, a high-voltage p-well (HVPW) region overlying the substrate and encircling the HVNW region, a p-type high-voltage anti-punch-through (HVNAPT) region only between the HVPW region and the substrate, wherein the HVNAPT region substantially overlaps the HVPW region, and wherein the HVNAPT region has a bottom substantially lower than a bottom of the HVNW region, an insulation region in the HVNW region, a gate dielectric extending from over the insulation region to over the HVPW region, a gate electrode on the gate dielectric, a first source/drain region in the HVNW region and adjacent the insulation region, and a second source/drain region in the HVPW region and adjacent the gate dielectric.

The advantageous features of the present invention include reduced resistivity in the HVNW region and improved drive current.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are described with reference to FIGS. 3 through 8A, and variations of the preferred embodiments are then discussed. Throughout the various views and illustrative embodiments of the present invention, like reference numbers are used to designate like elements.

Figure 1:
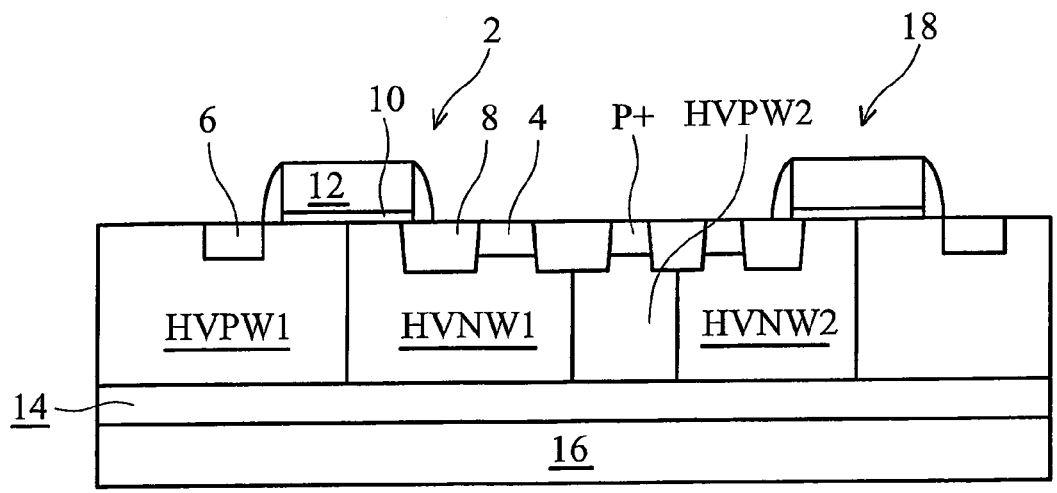
FIG. 1 illustrates conventional high-voltage n-type MOS (HVNMOS) devices.
Figure 2:
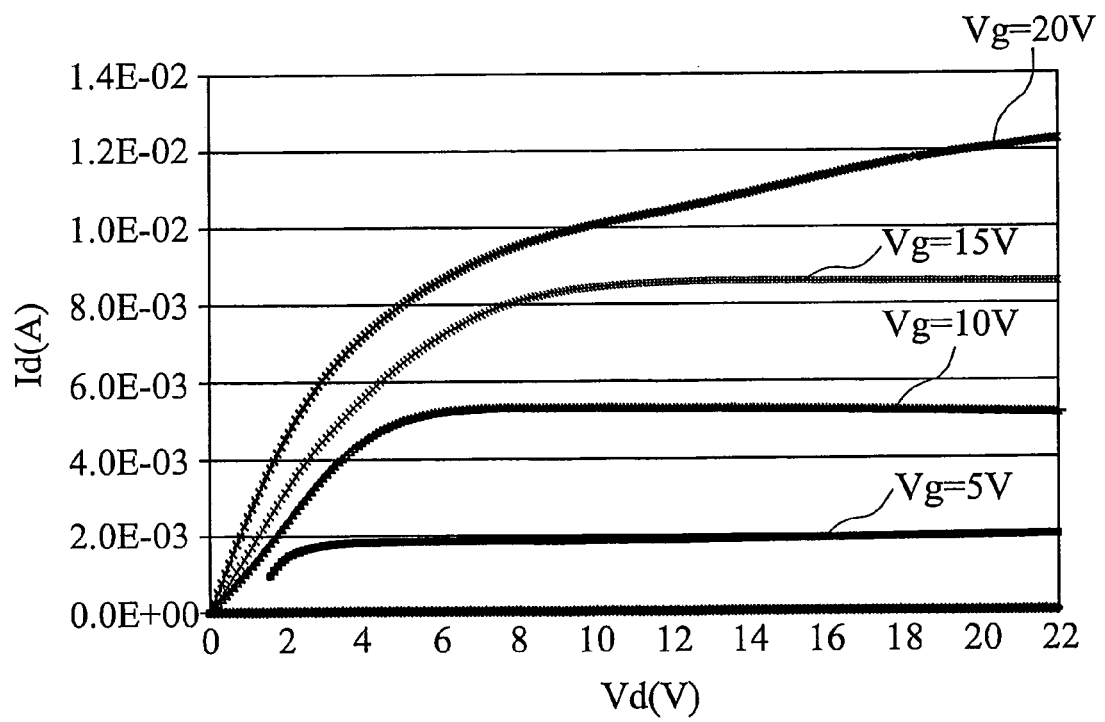
FIG. 2 illustrates an I-V curve of the HVNMOS devices shown in FIG. 1.
Figure 3:
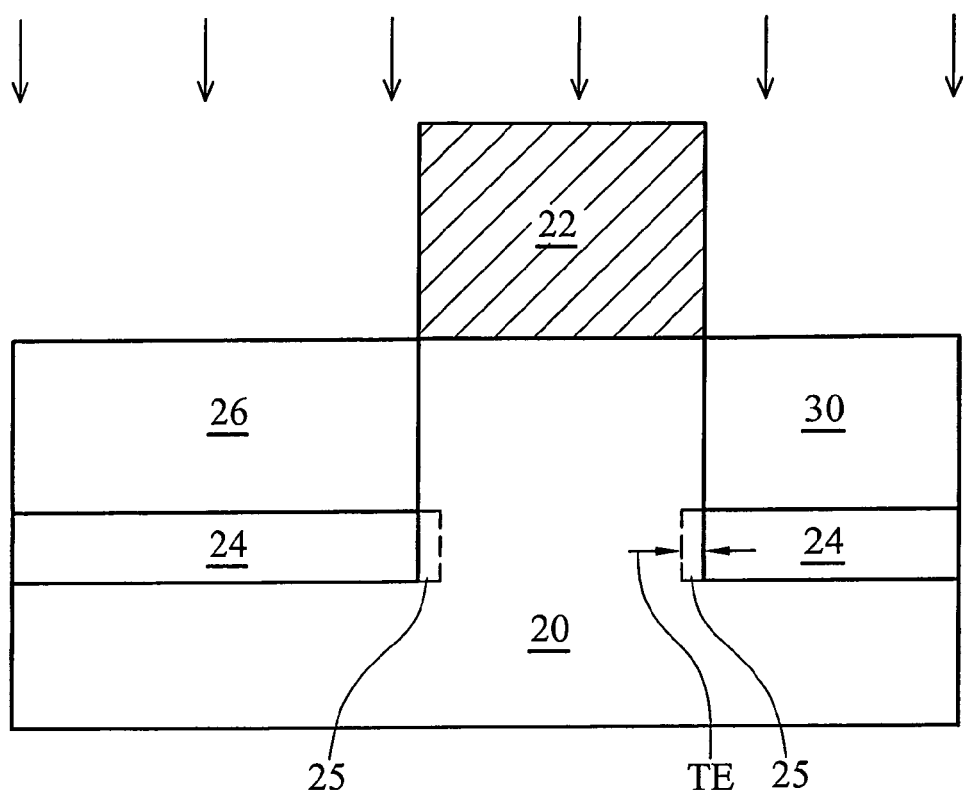
FIGS. 3, 4, 5A, 5B, 6, 7, and 8A are cross-sectional views of intermediate stages in the manufacture of an HVNMOS device.

Referring to FIG. 3, a substrate 20 is provided. Substrate 20 preferably comprises a semiconductor material such as silicon, although other semiconductor materials may be used. Preferably, substrate 20 is lightly doped with a p-type impurity, although it can also be doped with n-type impurities.

A photoresist 22 is formed and patterned using lithography techniques. High-voltage (HV) anti-punch-through (APT) regions 24 (also referred to as HVNAPT regions as the inversion regions formed in regions 24 are of n-type) are formed. HVNAPT regions 24 are preferably doped with p-type impurities, such as boron and/or indium. Preferably, the p-type impurity concentration in HVNAPT regions 24 is at least one order higher than the p-type impurity concentration in substrate 20. In an exemplary embodiment, the p-type impurity concentration in HVNAPT regions 24 is between about $10^{14}/\text{cm}^3$ to about $10^{17}/\text{cm}^3$.

FIG. 3 also illustrates the formation of high-voltage p-well (HVPW) regions 26 and 30 on HVNAPT regions 24. HVPW regions 26 and 30 are also preferably doped with a p-type impurity, such as boron and/or indium. Preferably, the p-type impurity concentration in HVPW regions 26 and 30 are greater than the p-type impurity concentration in HVNAPT regions 24, although the concentration in HVPW regions 26 and 30 may be equal to or smaller than the p-type impurity concentration in HVNAPT regions 24. In an exemplary embodiment, the p-type impurity concentration in HVPW regions 26 and 30 is between about $10^{14}/\text{cm}^3$ to about $10^{17}/\text{cm}^3$. Please note that although HVPW regions 26 and 30 may be two separate regions, they can also be portions of a continuous HVPW region encircling high-voltage n-well (HVNW) region 28, as is shown in FIG. 8B, which is a top view of the resulting HVNMOS device. After the formation of regions 24, 26 and 30, photoresist 22 is removed. Similarly, HVNAPT regions 24 may either be separate regions, or portions of a closed loop, depending on the shape of HVPW regions 26 and 30. One skilled in the art will realize that the order for forming regions 24, 26 and 30 is merely a design choice.

HVNAPT regions 24 may be formed using a same mask as the mask used for forming HVPW regions 26 and 30, as is illustrated in FIG. 3. However, they can be formed using different masks. One convenient feature of the present invention is that the mask for forming HVNAPT regions 24 may be formed through logic operations from conventional masks, wherein the new mask for HVNAPT regions 24 may be obtained by subtracting a conventional HVNAPT region by HVNW region 28 (refer to FIG. 4). In addition, through the logic operation, HVNAPT regions 24 may have a small overlap with HVNW region 28, wherein the overlapped regions 25 may have a width TE of less than, for example, about 1 μm.

Figure 4:
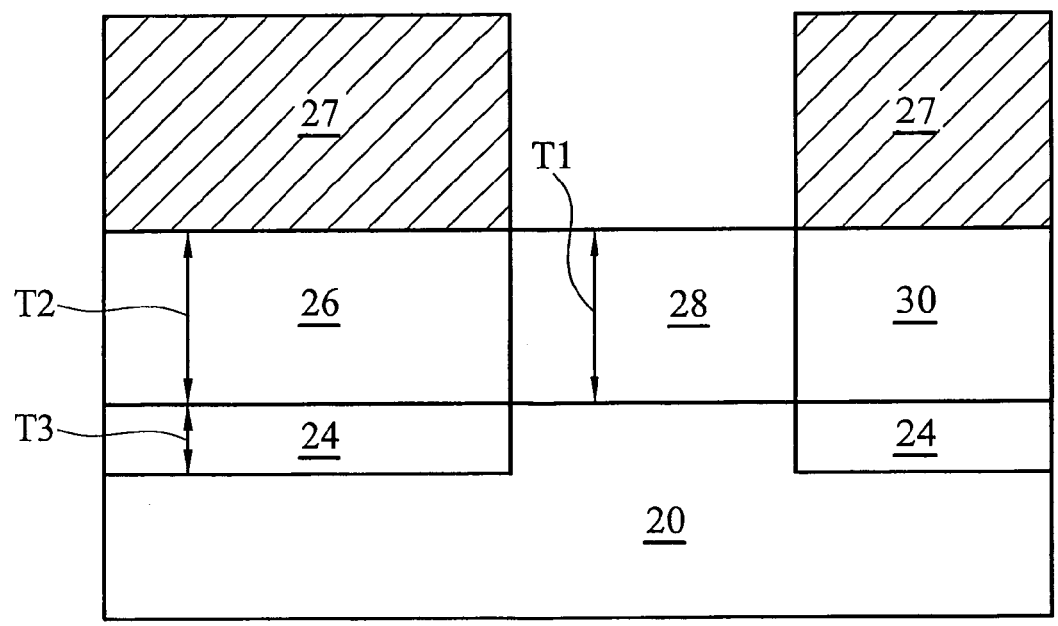

FIG. 4 illustrates the formation of high-voltage n-well (HVNW) region 28. Photoresist 27 is formed to mask the previously formed HNPW regions 26 and 30, and an n-type impurity, such as phosphorous, antimony and/or arsenic, is implanted. In an exemplary embodiment, HVNW region 28 has an impurity concentration of between about $10^{14}/\text{cm}^3$ to about $10^{17}/\text{cm}^3$.

Preferably, HVNW region 28 has a thickness T1 substantially equal to thickness T2 of HVPW regions 26 and 30. Therefore, HVNAPT regions 24 are located lower than the bottom level of regions 26, 28 and 30. The preferred thickness T3 of HVNAPT regions 24 partially depends on the concentration of p-type impurities in HVNAPT regions 24, and the thickness T3 may be reduced with an increased p-type impurity concentration. It should be appreciated that the thickness T3 of HVNAPT regions 24 may be scaled with the formation technology of the integrated circuits and with the voltages applied on drain regions of the respective HVNMOS devices. In an exemplary embodiment, thickness T3 is between about 10 nm and about 800 nm.

It is noted that HVNAPT regions 24 and HVPW region 26 can be formed as one region in a single process step, which may be achieved by more than one implant having different energies, thus the implanted impurity has a more uniform impurity concentration from a top surface of HVPW region 26 to a bottom surface of HVNAPT regions 24. Similarly, HVNAPT regions 24 and HVPW 30 may also be formed as one combined region. In this embodiment, the thickness of the combined regions is preferably substantially greater than thickness T1 of HVNW region 28, for example, by between about 10 nm and about 800 nm. Alternatively, thickness T3 of HVNAPT regions 24 is greater than about 1/10 of thicknesses T1 of HVPW regions 26 and T2.

In other embodiments, HVPW regions 26 and 30, HVNW region 28, and HVNAPT regions 24 may be formed by epitaxially growing a doped semiconductor layer, which has thickness T1 as illustrated in FIG. 4, on substrate 20. The doped semiconductor layer is preferably doped with an n-type impurity to a concentration of essentially the same as in HVNW region 28. A photoresist, which is essentially the same as photoresist 22 in FIG. 3, is then formed, and HVPW regions 26 and 30 and HVNAPT regions 24 are formed by implanting p-type impurities. The n-type impurity in the doped semiconductor layer is neutralized by the implanted p-type impurity, and the net concentration of implanted regions 24, 26 and 30 are essentially the same as discussed in the preceding paragraphs. The un-implanted region of the doped semiconductor layer thus forms HVNW region 28.

Figure 5A:
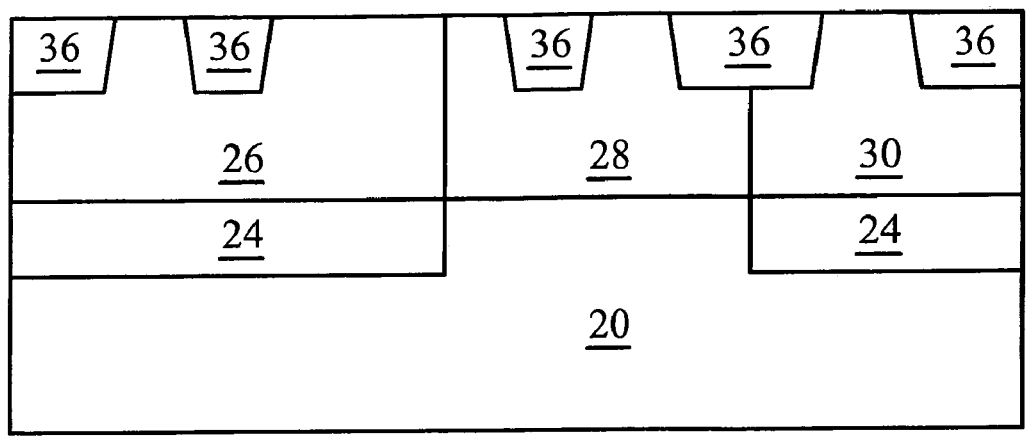
Figure 5B:
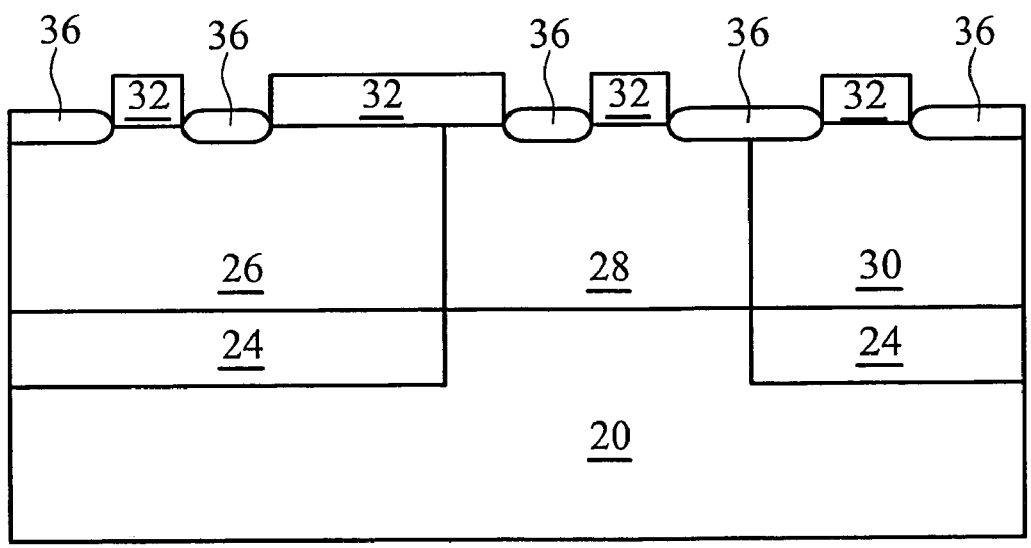

FIGS. 5A and 5B illustrate the formation of insulation regions 36. In the preferred embodiment, as is shown in FIG. 5A, insulation regions 36 are formed by forming trenches in HVPW regions 26 and 30 and HVNW region 28, filling the trenches with a dielectric material, such as $SiO_2$ or high-density plasma (HDP) oxide, and performing a chemical mechanical polish to level the surface of the filled dielectric material to top surfaces of regions 26, 28 and 30. The resulting shallow trench isolation (STD regions are insulation regions 36. In other embodiments, as shown in FIG. 5B, a mask layer 32, preferably formed of SiN, is formed over HVPW region 26 and 30 and HVNW region 28. Mask layer 32 is then patterned to form openings. An oxidation is then performed, and insulation regions (also referred to as field oxides) 36 are formed in openings 30. Typically, for 0.25 μm technology and under, field regions are preferably STI regions. For technologies with greater scale, field regions are preferably field oxides.

Figure 6:
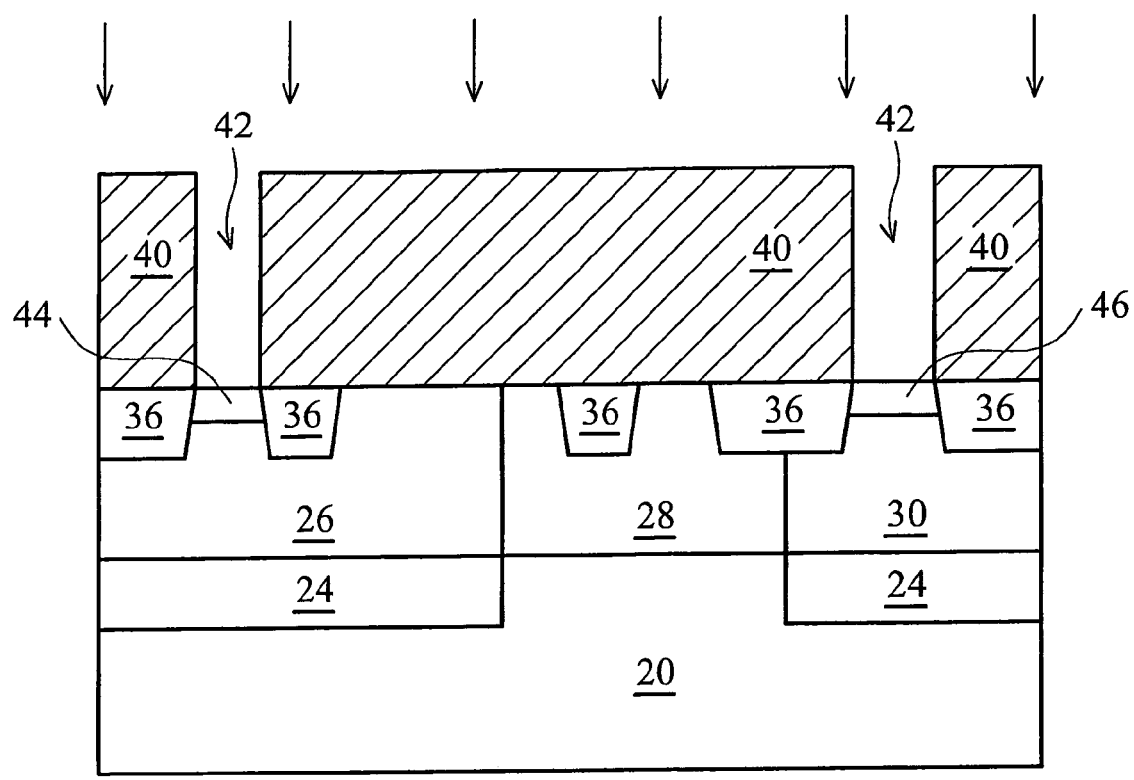

Referring to FIG. 6, a photoresist 40 is deposited and patterned, forming openings 42. A p-type dopant implantation is performed, forming P+ regions 44 and 46 in HVPW regions 26 and 30, respectively. Preferably, P+ regions 44 and 46 comprise boron and/or other p-type dopants and are heavily doped to a concentration of greater than about $10^{20}/cm^3$. P+ regions 44 and 46 act as the contacts for pick-up regions. Photoresist 40 is then removed.

Figure 7:
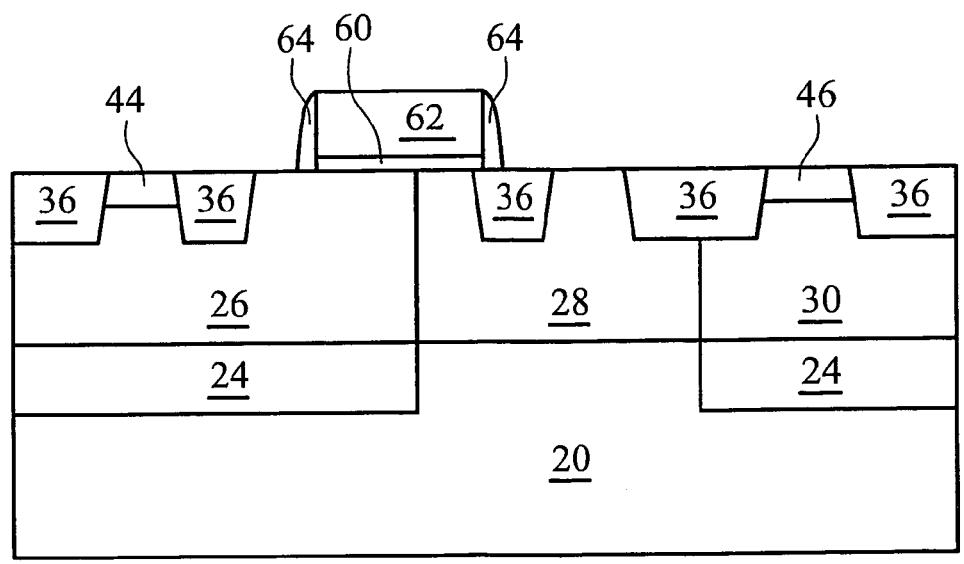

FIG. 7 illustrates the formation of a gate dielectric 60, a gate electrode 62 and gate spacers 64. As is known in the art, gate dielectric 60 preferably comprises silicon oxide, although other dielectric materials such as silicon nitride, silicon carbide, silicon oxynitride, combinations thereof, and multi-layers thereof, can be used. Gate electrode 62 preferably includes doped polysilicon. Alternatively, metals, metal nitrides, metal silicides, and other conductive materials can be used. Gate spacers 64 are preferably formed by blanket forming a dielectric material, and removing undesired portions from horizontal surfaces. The details of formation processes of gate dielectric 60, gate electrode 62, and gate spacers 64 are well known in the art, and thus are not repeated herein. Preferably, a side edge of gate electrode 62 is over the insulation regions 36 in HVNW region 28.

Figure 8A:
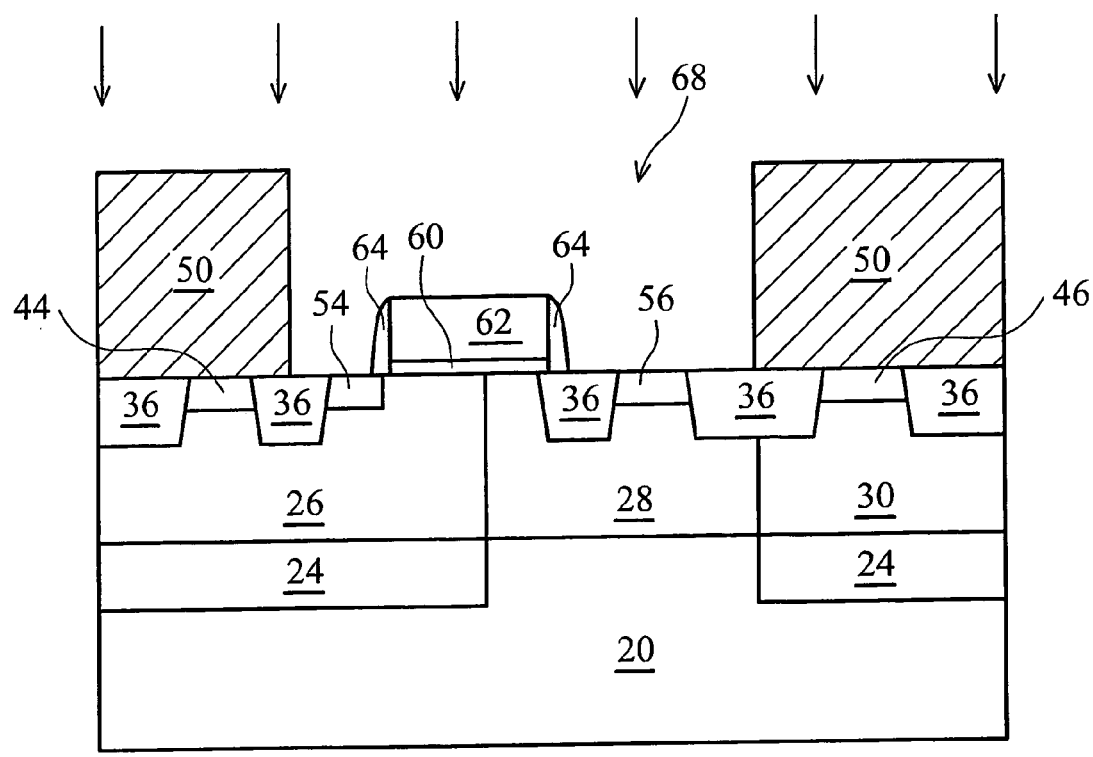
Figure 8B:
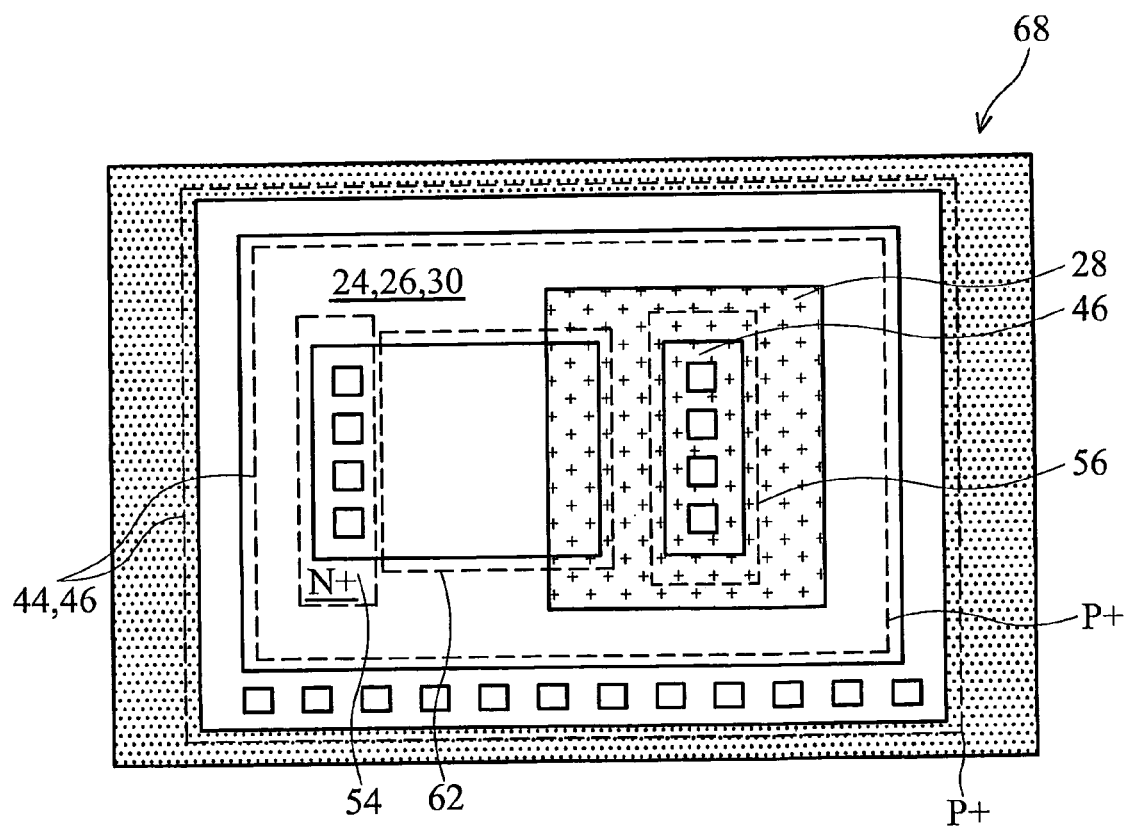
FIG. 8B illustrates a top view of the HVNMOS device shown in FIG. 8A.

Referring to FIG. 8A, photoresist 50 is formed and patterned. An n-type impurity implantation is performed, forming N+ region 54 in HVPW region 26 and N+ region 56 in HVNW region 28. HVNMOS device 68 is thus formed. The N+ dopant may comprise phosphorus and/or arsenic (As). Preferably, the n-type dopant is heavily doped to a concentration of greater than about $10^{20}/cm^3$. In the described embodiments, heavily doped means an impurity concentration of above about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. N+ region 54 forms the source region of the resulting HVNMOS device 68, while N+ region 56 forms the drain region of HVNMOS device 68. After the implantation, photoresist 50 is removed. Since gate electrode 62 is spaced apart from N+ region 56, a high voltage can be applied.

Alternatively, N+ regions 54 and 56 may be formed before the formation of gate dielectric 60, gate electrode 62 and gate spacers 64. One skilled in the art will realize the respective process steps of for the formation.

FIG. 8B illustrates a top view of an exemplary layout of HVNMOS device 68. In the illustrated layout, an HVPW region, which includes HVPW regions 26 and 30, encircles HVNW region 28, wherein the HVPW region occupies the entire illustrated region except HVNW region 28. Portions of the HVPW regions 26 and 30 may have insulation regions 36 on top. Accordingly, HVNAPT regions 24, which preferably overlap HVPW regions 26 and 30, also encircle HVNW region 28. A region defined by two dotted squares, which are marked as "44, 46" is a P+ region including regions 44 and 46. It is to be noted that the embodiments of the present invention may be implemented with a variety of layouts, and the layout shown in FIG. 8B is merely an example.

Figure 9:
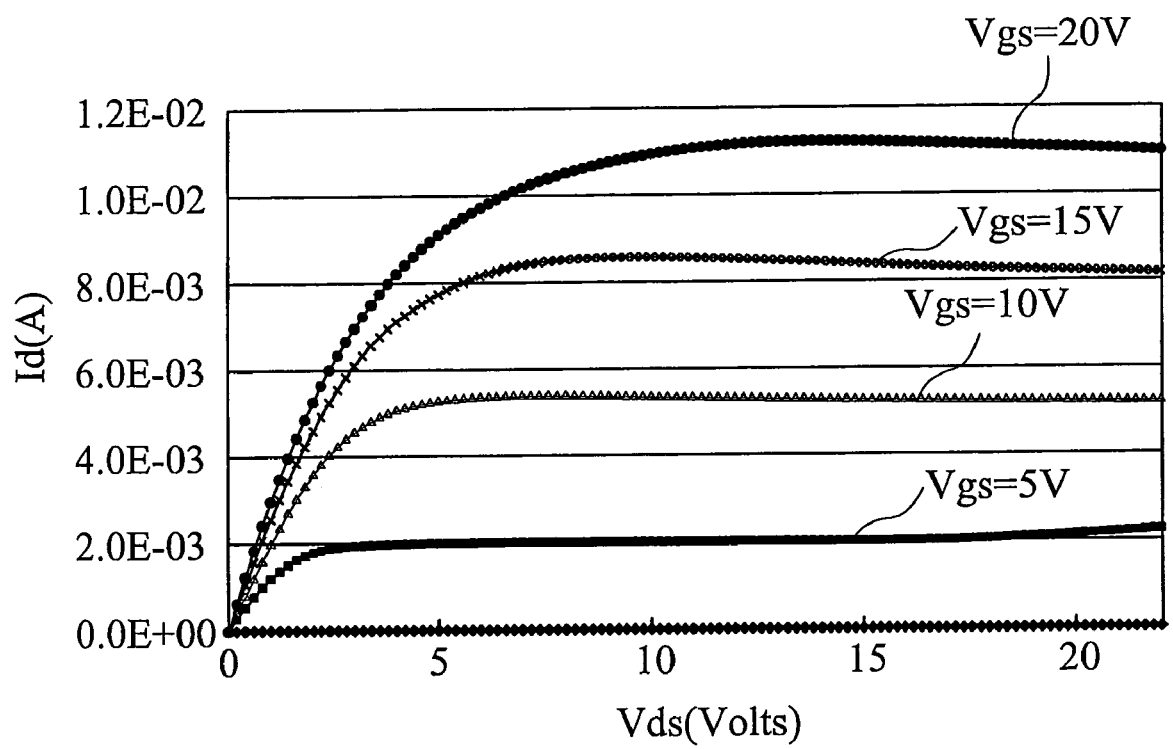
FIG. 9 illustrates an I-V curve of an HVNMOS device embodiment of the present invention.

FIG. 9 illustrates $I_d$-$V_d$ characteristics measured from an HVNMOS device embodiment of the present invention. It is noted that when a gate of the HVNMOS device is applied with a high voltage, such as 20 volts, the I-V curve pinches when drain-source voltages around 12 volts. This indicates that the reliability of the HVMOS devices formed using the embodiments of the present invention is improved.

If an HVNAPT region is formed underlying HVNW region 28, the p-type impurity atoms in the HVNAPT region will diffuse into HVNW region 28 and neutralize the n-type impurity in HVNW region 28. This in turn causes the increase in resistance in HVNW region 28 and degradation in device drive current. An advantageous feature of the present invention is that by removing HVNAPT region, which has p-type impurities, from underlying HVNW region 28, atoms of p-type impurity diffused into HVNW region 28 are significantly reduced.

Figure 10:
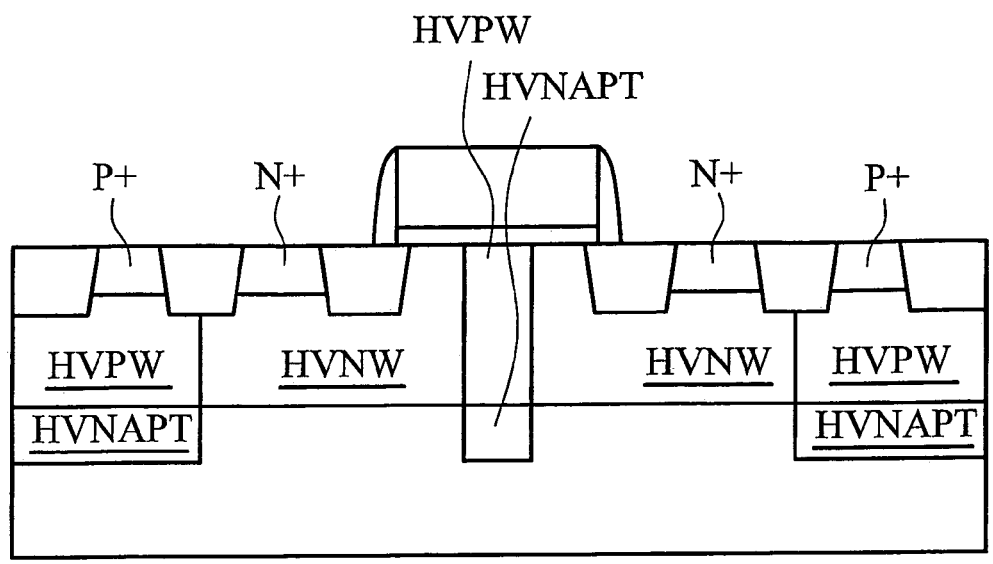
FIG. 10 illustrates a symmetric HVNMOS device embodiment.

The previously illustrated embodiments have asymmetric structures, wherein source and drain regions are in different types of high-voltage well regions. FIG. 10 illustrates an HVNMOS embodiment having a symmetric structure, wherein the HVNMOS device includes two HVNW regions and an HVPW region therebetween. Similar to the embodiment illustrated in FIG. 8A, HVNAPT regions are formed under HVPW regions, while HVNW regions have substantially no underlying HVNAPT regions.

Figure 11:
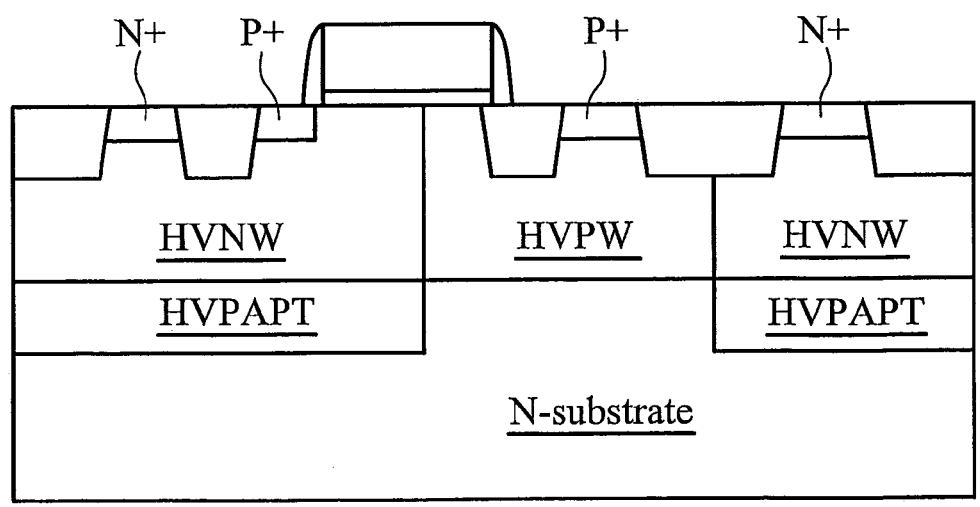
FIG. 11 illustrates a high-voltage p-type MOS device embodiment.

Although the preferred embodiments illustrate the formation of an HVNMOS device, one skilled in the art will realize the respective formation steps for forming HVPMOS devices, with the conductivity type of HVNW region 28, HVPW region 26 and 30, and source/drain regions 54 and 56, etc., reversed (refer to FIG. 8A). An exemplary illustrative embodiment is shown in FIG. 11. It should also be appreciated that HVMOS devices have various different layouts. However, the concept of the present invention may still be applied. Similarly, a symmetric HVPMOS device may be formed by reversing the conductivity types of the doped regions in FIG. 10.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor structure comprising:
a substrate;

a first high-voltage well (HVW) region of a first conductivity type overlying the substrate, wherein no well region is directly underlying the first HVW region;
a second HVW region of a second conductivity type opposite the first conductivity type overlying the substrate and laterally contacting the first HVW region;
a third HVW region of the second conductivity type underlying the second HVW region, wherein the third HVW region substantially does not extend into the region directly underlying the first HVW region, and wherein the third HVW region has a bottom substantially lower than a bottom of the first HVW region;
an insulation region in a portion of the first HVW region and extending from a top surface of the first HVW region into the first HVW region;
a gate dielectric extending from over the first HVW region to over the second HVW region, wherein the gate dielectric has a portion over the insulation region;
a gate electrode on the gate dielectric;
a fourth HVW region of the second conductivity type overlying the substrate and laterally contacting the first HVW region, wherein the fourth HVW region is on an opposite side of the first HVW region relative to the second HVW region, and wherein the gate dielectric does not extend into the region directly over the fourth HVW region; and
a fifth HVW region of the second conductivity type underlying the fourth HVW region, wherein the fifth HVW region does not extend into the region directly underlying the first HVW region, and wherein the fifth HVW region has a bottom substantially lower than the bottom of the first HVW region.

2. The semiconductor structure of claim 1, wherein the first conductivity type is n-type and the second conductivity type is p-type.

3. The semiconductor structure of claim 1, wherein edges of the third HVW region are substantially aligned with edges of the second HVW region.

4. The semiconductor structure of claim 1, wherein the bottom of the third HVW region is lower than the bottom of the first HVW region by greater than about 10 nm.

5. The semiconductor structure of claim 1, wherein the third HVW region has an impurity concentration substantially close to an impurity concentration of the second HVW region.

6. The semiconductor structure of claim 1, wherein the third HVW region has an impurity concentration higher than an impurity concentration of the substrate by greater than about one order.

7. The semiconductor structure of claim 1, wherein the first and the third HVW regions are in physical contact with the substrate.

8. The semiconductor structure of claim 1 further comprising:
a first source/drain region in the first HVW region and adjacent the insulation region, wherein the first source/drain region is selected from the group consisting of a source region and a drain region; and
a second source/drain region in the second HVW region and adjacent the gate dielectric.

9. The semiconductor structure of claim 1, wherein the first, the second, and the third HVW regions have impurity concentrations between about $10^{14}/cm^3$ and about $10^{17}/cm^3$.

10. A semiconductor structure comprising:
a substrate;
a first high-voltage well (HVW) region of a first conductivity type overlying and contacting the substrate, wherein no well region is directly underlying the first HVW region wherein the substrate is of a second conductivity type opposite the first conductivity type;
a second HVW region of a second conductivity type opposite the first conductivity type overlying the substrate and laterally contacting the first HVW region;
a third HVW region of the second conductivity type underlying the second HVW region, wherein the third HVW region substantially does not extend into the region directly underlying the first HVW region, and wherein the third HVW region has a bottom substantially lower than a bottom of the first HVW region;
an insulation region in a portion of the first HVW region and extending from a top surface of the first HVW region into the first HVW region;
a gate dielectric extending from over the first HVW region to over the second HVW region, wherein the gate dielectric has a portion over the insulation region; and
a gate electrode on the gate dielectric.

11. The semiconductor structure of claim 10, wherein the first conductivity type is n-type and the second conductivity type is p-type.

12. The semiconductor structure of claim 10, wherein edges of the third HVW region are substantially aligned with edges of the second HVW region.

13. The semiconductor structure of claim 10, wherein the bottom of the third HVW region is lower than the bottom of the first HVW region by greater than about 10 nm.

14. The semiconductor structure of claim 10, wherein the third HVW region has an impurity concentration substantially close to an impurity concentration of the second HVW region.

15. The semiconductor structure of claim 10, wherein the third HVW region has an impurity concentration higher than an impurity concentration of the substrate by greater than about one order.

16. The semiconductor structure of claim 10 further comprising a fourth HVW region of the first conductivity type on an opposite side of the first HVW region than the second HVW region, wherein the fourth HVW region has a same thickness as the first HVW region does, and wherein a region underlying the fourth HVW region is substantially free from the third HVW region, and wherein the gate dielectric extends over the fourth HVW region.

17. The semiconductor structure of claim 10, wherein the third HVW region is in physical contact with the substrate.

18. The semiconductor structure of claim 10 further comprising:
a first source/drain region in the first HVW region and adjacent the insulation region, wherein the first source/drain region is selected from the group consisting of a source region and a drain region; and
a second source/drain region in the second HVW region and adjacent the gate dielectric.

* * * * *